(12) United States Patent
Kim et al.

(10) Patent No.: US 7,807,517 B2
(45) Date of Patent: *Oct. 5, 2010

(54) METHOD OF FABRICATING A SEMICONDUCTOR DEVICE HAVING A SINGLE GATE ELECTRODE CORRESPONDING TO A PAIR OF FIN-TYPE CHANNEL REGIONS

(75) Inventors: Suk-Pil Kim, Yongin-si (KR);
Yoon-Dong Park, Yongin-si (KR);
Won-Joo Kim, Suwon-si (KR);
Dong-Gun Park, Seongnam-si (KR);
Eun-Suk Cho, Suwon-si (KR);
Suk-Kang Sung, Seongnam-si (KR);
Byung-Yong Choi, Seongnam-si (KR);
Tae-Yong Kim, Suwon-si (KR);
Choong-Ho Lee, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 12/219,737

(22) Filed: Jul. 28, 2008

(65) Prior Publication Data

US 2008/0293215 A1    Nov. 27, 2008

Related U.S. Application Data

(63) Continuation of application No. 11/505,335, filed on Aug. 17, 2006, now Pat. No. 7,419,859.

(30) Foreign Application Priority Data

Aug. 30, 2005    (KR) .................... 10-2005-0079993

(51) Int. Cl.
*H01L 21/00* (2006.01)
*H01L 21/84* (2006.01)

(52) U.S. Cl. .................. 438/153; 438/151; 257/E21.65
(58) Field of Classification Search .................. 438/164, 438/151, 153, 435
See application file for complete search history.

(56) References Cited

U.S. PATENT DOCUMENTS

| 6,525,403 | B2 |  | 2/2003 | Inaba et al. |
| 7,122,871 | B2 |  | 10/2006 | Lee et al. |
| 7,352,037 | B2 | * | 4/2008 | Kim et al. .................... 257/401 |

(Continued)

*Primary Examiner*—Phat X Cao
*Assistant Examiner*—Nga Doan
(74) *Attorney, Agent, or Firm*—Harness, Dickey & Pierce, P.L.C.

(57) ABSTRACT

Provided are methods for fabricating semiconductor devices incorporating a fin-FET structure that provides body-bias control, exhibits some characteristic advantages associated with SOI structures, provides increased operating current and/or reduced contact resistance. The methods for fabricating semiconductor devices include forming insulating spacers on the sidewalls of a protruding portion of a first insulation film; forming a second trench by removing exposed regions of the semiconductor substrate using the insulating spacers as an etch mask, and thus forming fins in contact with and supported by the first insulation film. After forming the fins, a third insulation film is formed to fill the second trench and support the fins. A portion of the first insulation film is then removed to open a space between the fins in which additional structures including gate dielectrics, gate electrodes and additional contact, insulating and storage node structures may be formed.

15 Claims, 8 Drawing Sheets

U.S. PATENT DOCUMENTS

| | | | |
|---|---|---|---|
| 7,419,859 B2 * | 9/2008 | Kim et al. | 438/164 |
| 7,573,108 B2 * | 8/2009 | Juengling | 257/401 |
| 2004/0217433 A1 | 11/2004 | Yeo et al. | |
| 2005/0104130 A1 * | 5/2005 | Nowak et al. | 257/368 |
| 2005/0110079 A1 * | 5/2005 | Nowak | 257/331 |
| 2007/0045750 A1 | 3/2007 | Liao et al. | |
| 2007/0235833 A1 | 10/2007 | Cheng et al. | |
| 2007/0267668 A1 | 11/2007 | Fischer | |
| 2007/0281488 A1 | 12/2007 | Wells et al. | |

* cited by examiner

METHOD OF FABRICATING A SEMICONDUCTOR DEVICE HAVING A SINGLE GATE ELECTRODE CORRESPONDING TO A PAIR OF FIN-TYPE CHANNEL REGIONS

PRIORITY STATEMENT

This is a continuation application of application Ser. No. 11/505,335 filed Aug. 17, 2006 now U.S. Pat. No. 7,419,859, which claims the benefit of Korean Patent Application No. 10-2005-0079993, filed on Aug. 30, 2005, in the Korean Intellectual Property Office, the disclosures of which are incorporated herein in their entirety by reference.

BACKGROUND OF THE INVENTION

1. Field of the Invention

The invention relates to methods for manufacturing semiconductor devices, and more particularly, to methods for manufacturing semiconductor devices that include fin-type channel regions.

2. Description of the Related Art

Field effect transistors have been manufactured with fin channel structures (hereinafter, referred to as fin-FETs) for improving certain device performance parameters in the resulting semiconductor devices. One example of a memory cell utilizing a fin-FET structure is disclosed in U.S. Pat. No. 6,664,582 to David M. Fried et al. ("Fried") entitled "FIN MEMORY CELL AND METHOD OF FABRICATION," and another example can be found in U.S. Pat. No. 6,876,042 to Bin Yu et al. ("Yu") entitled "ADDITIONAL GATE CONTROL FOR A DOUBLE-GATE MOSFET" which discloses a fin-FET including fins formed on an insulation layer.

Because the top surfaces and side surfaces of the fins in a fin-FET can be used as channel regions, fin-FETs can have wider channel regions than planar transistors formed in the same surface area. Accordingly, fin-FETs can provide increased operation current, thereby providing improved performance relative to corresponding planar transistors.

The fin-FETs disclosed in both Fried and Yu, however, are fabricated using silicon-on-insulator (SOI) substrates in which the fins are insulated from the bulk substrate bodies. Accordingly, the threshold voltage of the fin-FET transistors cannot be effectively controlled using body-bias, thereby complicating efforts to control the threshold voltage of the resulting CMOS transistors. However, if a conventional bulk substrate is used to allow for more effective body-bias control, the resulting increase in the extent of the drain depletion region tends to increase a junction leakage current, off current, and junction capacitance, thereby degrading the performance of the semiconductor devices. In addition, in highly integrated devices, there tend to be additional deceases in threshold voltage and corresponding increases in off current as a result of short channel effects.

Another problem associated with fin-FETs is high contact resistance. According to Fried, for example, the fin-FET includes bit line contacts formed across and contacting the top surfaces of the fins. However, because the bit lines contact only the narrow top surfaces of the fins, the resistance of these bit line contacts may be very high and will tend to degrade the performance of the resulting devices. The configuration of the fins may be modified, for the example, the fins may be bent, in order to increase the area available for forming the bit line contacts and reduce the contact resistance. Reconfiguring the fin structure, however, tends to increase the complexity of the semiconductor device fabrication, thereby increasing costs and tending to suppress yield.

According to Yu, the sizing of the source and drain regions in contact with fins may be increased to provide greater contact area. However, as the distance between the fins is increased to accommodate the enlarged source and drain regions, the overall degree of integration of the resulting fin-FET device will be reduced.

Another problem associated with fabricating fin-FETs is damage to and/or collapse of the thin fins protruding from a substrate. The likelihood of such damage or collapse increases as the widths of the fins is reduced. For example, as illustrated in Fried, elongated fins project from the substrate and are not initially provided with any supporting or reinforcing structures. Accordingly, forming the fins as suggested by Fried produces fin structures that are susceptible to mechanical damage and which may collapse or suffer damage during subsequent fabricating processes.

SUMMARY OF THE INVENTION

Example embodiments of the invention include methods of fabricating semiconductor devices that provide for body-bias control, utilize a SOI structure, exhibit improved operating current and reduced contact resistance.

A method for manufacturing a semiconductor device according to an example embodiment of the invention includes: forming a first insulation film in a first trench in a semiconductor substrate with a protruding portion of the first insulation film extending above a surface of the semiconductor substrate; forming a second insulation layer spacer adjacent the sidewalls of the protruding portion of the first insulation film wherein the spacers cover a first surface region and expose a second surface region of the semiconductor substrate; forming a second trench by removing a portion of the semiconductor substrate below the second surface region using the second insulation layer spacer as an etch protection film to form a pair of fins adjacent opposite sides of the first insulation film; forming a third insulation film filling the second trench; removing an upper portion of the first insulation film to form a residual first insulation film and expose portions of the sidewall of the opposing fins; forming an insulating layer, for example, a gate dielectric, on the exposed portions of the fin sidewalls; and forming a gate electrode between the pair of fins and insulated from the pair of fins by the insulating layer.

Another method for manufacturing a semiconductor device according to an example embodiment of the invention includes forming a storage node, which is insulated from the gate electrode, between the gate insulation film and the gate electrode.

Another method for manufacturing a semiconductor device according to an example embodiment of the invention includes: forming a first insulation film in a first trench formed in a semiconductor substrate wherein a portion of the first insulation film protrudes above the surface of the semiconductor substrate; forming a second insulation layer spacers on both sidewalls of the protruding portion of the first insulation film, the spacers covering a first portion of the semiconductor substrate and exposing a second portion of the semiconductor substrate; forming a second trench by removing a portion of the exposed second portion of the semiconductor substrate wherein the second insulation layer spacer is used as an etch protection film to form a pair of fins adjacent opposite sides of the first insulation film; forming a third insulation film to fill the second trench; forming an etch mask that exposes the first insulation film and covers the third insulation film; etching the exposed first insulation film to a predetermined depth below a surface of the third insulation film; forming a gate electrode on the residual first insulation film between the pair of fins, wherein the gate electrode is insulated from the pair of fins; and forming a source contact plug and a drain contact plug on opposite sides of the gate electrode and between the pair of fins, wherein the contact plugs are in electrical contact with portions of the opposing sidewalls of the pair of fins.

Other example embodiments of methods according to the invention can include processes during which an etch mask may be formed for further exposing the pair of fins; during which a sidewall of an etch mask may be formed in contact with the pair of fins; or during which an etch mask may be formed to provide additional coverage for the pair of fins. Further, as used herein, the term "layer" refers to a continuous mass of material formed across a surface while the terms "film" and "pattern" refer to the residual portions of a layer after portions of the layer have been removed, e.g., by developing an exposed photoresist layer; by etching a layer that is partially protected by an etch mask and/or by removing an upper portion of a layer during a planarization process. Similarly, for ease of reference, the sidewalls of the fins formed adjacent the first insulation film may be referred to as the "inner" sidewalls while those sidewalls adjacent the third insulation film may be referred to as the "outer" sidewalls. Consistent with this terminology, the inner sidewalls will oppose each other across the space created when a portion of the first insulation film is removed.

BRIEF DESCRIPTION OF THE DRAWINGS

Example embodiments of the methods that may be utilized in practicing the invention and example embodiments of the fin structures and semiconductor devices incorporating such structures are addressed more fully below with reference to the attached drawings in which.

It should be noted that these Figures are intended to illustrate the general characteristics of methods and materials of certain example embodiments of the invention to supplement the written description provided below. These drawings are not, however, to scale and may not precisely reflect the characteristics of any given embodiment, and should not be interpreted as defining or limiting the range of values or properties of embodiments within the scope of this invention. In particular, the relative thicknesses and positioning of layers or regions may be reduced or exaggerated for clarity. The use of similar or identical reference numbers in the various drawings is intended to indicate the presence of a similar or identical element or feature.

DETAILED DESCRIPTION OF THE INVENTION

Hereinafter, the invention will be described more fully with reference to the accompanying drawings, in which certain example embodiments of the invention are shown. As will be appreciated by those skilled in the art, the invention may be embodied in many different forms and should not, therefore, be construed as limited to the example embodiments. These example embodiments are provided so that this disclosure will be thorough and complete and thereby fully convey the concept of the invention to those skilled in the art.

A semiconductor device according to embodiments of the invention may be a field effect transistor having a fin structure (hereinafter, referred to as fin-FET) in which the fin is used as a channel region and/or forms a portion of a memory device cell. The memory device may be a random access memory, for example, a dynamic random access memory (DRAM), a phase change random access memory (PRAM), a resistance random access memory (RRAM), a ferroelectric random access memory (FeRAM), or a NOR type flash memory.

First Example Embodiment

Figure 1:
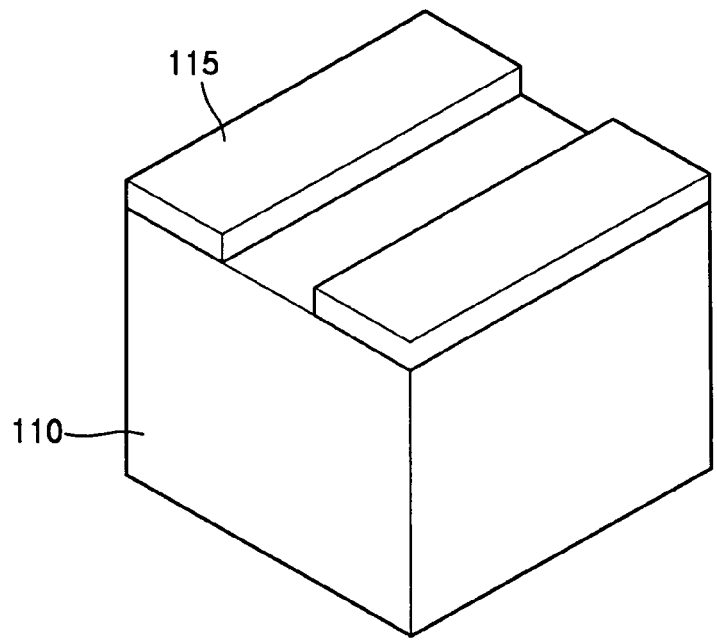
FIGS. 1 through 10 are perspective views illustrating a method of fabricating a semiconductor device according to an example embodiment of the invention.

FIGS. 1-10 are perspective views illustrating a method of fabricating a semiconductor device according to a first example embodiment of the invention. As illustrated in FIG. 1, a hard mask pattern 115 is formed on a semiconductor substrate 110. The semiconductor substrate 110 may be formed of a single semiconductor material, for example, bulk silicon or bulk silicon-germanium, or may have a more complex structure in which, for example, a silicon or silicon-germanium epitaxial layer is provided on bulk silicon or bulk silicon-germanium. The hard mask pattern 115 may define a region where a first trench 120 (see FIG. 2) will be formed. For example, the hard mask pattern 115 may be a line pattern or a pattern including a plurality of straight lines, although two straight lines are illustrated in FIG. 1.

A hard mask layer (not shown) is formed on the semiconductor substrate 110 and is patterned, thereby forming the hard mask pattern 115. The patterning operation can be performed using conventional photolithography and etching techniques. The hard mask layer may be formed of a material exhibiting an etch selectivity relative to the semiconductor substrate 110, i.e., the mask material will be removed more slowly than the semiconductor substrate. The hard mask layer may be, for example, a nitride layer or an oxynitride layer.

Figure 2:
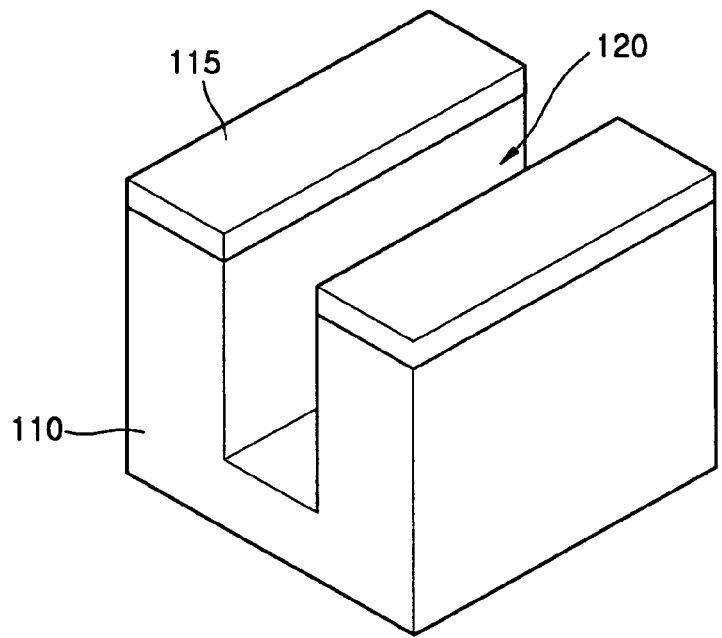

As illustrated in FIG. 2, the exposed portion of the semiconductor substrate 110 is then removed using the hard mask pattern 115 as an etch protection film to form a first trench 120. The depth of the first trench 120 will typically correspond generally to the desired height of the subsequently formed fins 105*a* and 105*b* (see FIG. 5). Although a single first trench 120 is illustrated in the drawings, a plurality of first trenches 120 may be arrayed across the surface of the substrate and may include first trenches having different configurations and/or different trench-to-trench spacings.

Figure 3:
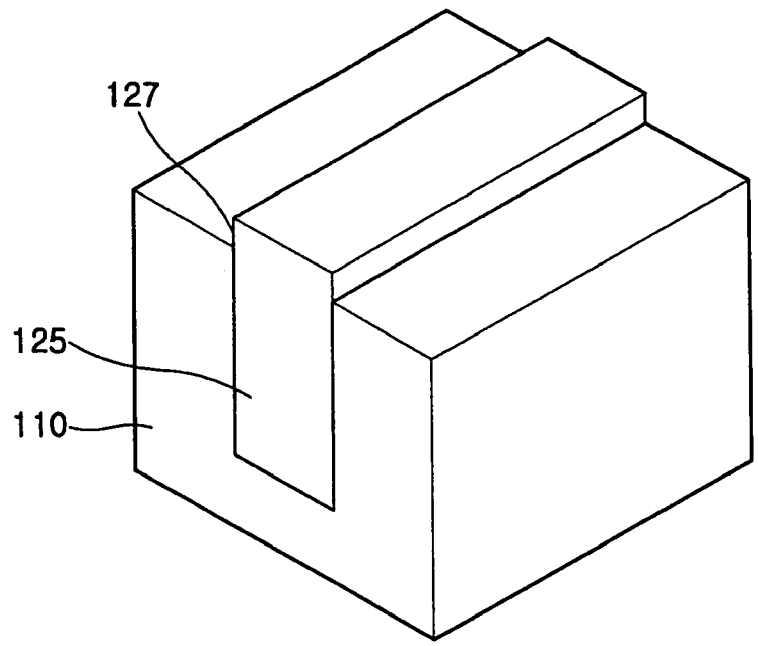

As illustrated in FIG. 3, a first insulation film 125 is formed on the substrate to a thickness sufficient to fill the first trench 120. Specifically, a first insulation layer (not shown) is deposited on the entire top surface of the structure illustrated in FIG. 2 in order to fill at least the first trench 120. The first insulation layer may be, for example, an oxide layer. Next, an upper portion of the first insulation layer is removed to expose an upper surface of the hard mask pattern 115, thereby forming the first insulation film 125 and providing a planarized surface. The planarizing process can, for example, be performed using an etch-back method or a chemical mechanical polishing (CMP) method.

The hard mask pattern 115 is then removed without removing a corresponding thickness of the first insulation film 125. Accordingly, the first insulation film 125 fills the first trench 120 and includes an upper portion that protrudes above the top surface of the surrounding semiconductor substrate 110. The hard mask pattern 115 will, accordingly, typically be removed using an etch process that exhibits an etch selectivity for the hard mask pattern relative to the first insulation film 125. For example, as suggested above, if the first insulation film 125 is an oxide layer, the hard mask pattern 115 may be an oxynitride layer or a nitride layer.

Figure 4:
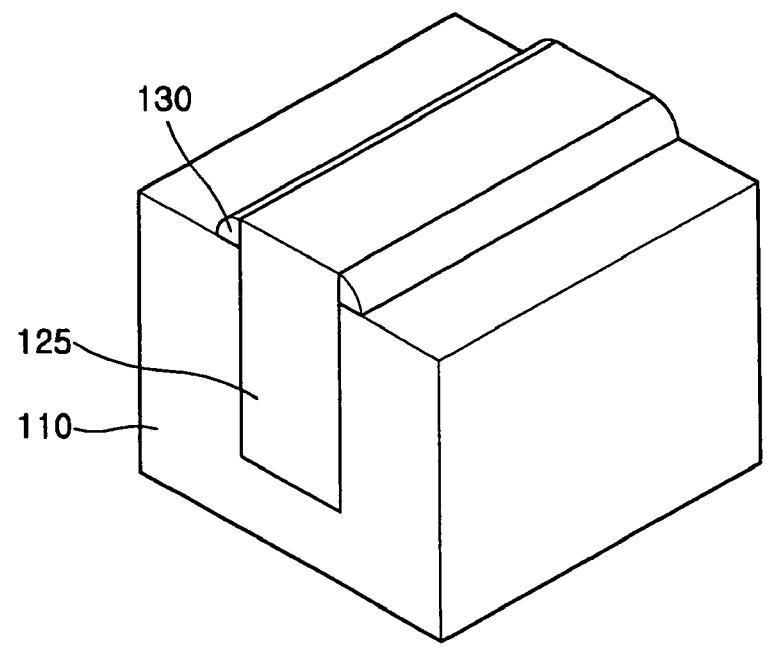

As illustrated in FIG. 4, a second insulation layer spacer 130 is formed adjacent the sidewalls 127 of the upper portion of the first insulation film 125 that protrudes from the semiconductor substrate 110. Each of the second insulation layer spacers 130 covers a portion of the top surface of the semiconductor substrate 110 adjacent the first insulation film 125 with the width of the spacer generally corresponding to the width of fins 105a and 105b (see FIG. 5) that will be formed. The remaining portion of the top surface of the semiconductor substrate 110 is exposed.

The second insulation layer spacers 130 may be formed using a conventional process in which a conformal material layer is formed on the structure as illustrated in FIG. 3 and then etched to remove the majority of the layer. For example, a second insulation layer (not shown) is formed over a structure of FIG. 3 and then anisotropically etched to expose the remaining surface portion of the semiconductor substrate 110. As a result of the directional etching characteristics of the anisotropic etch, the second insulation layer spacers 130 will be formed adjacent the sidewalls 127 of the protruding portion of the first insulation film 125. That is, the second insulation layer spacers 130 can be formed on the sidewalls 127 of the protruding portion of the first insulation film 125 in a self-aligning manner.

The width of the second insulation layer spacers 130 can be determined by controlling factors including, for example, the height of the protruding portion of the first insulation film 125, the thickness of the second insulation layer (not shown), and the anisotropic character of the etch process. For example, the second insulation layer may be, for example, a nitride layer or an oxynitride layer and the sizing may be controlled to produce fins having sub-micron widths.

Figure 5:
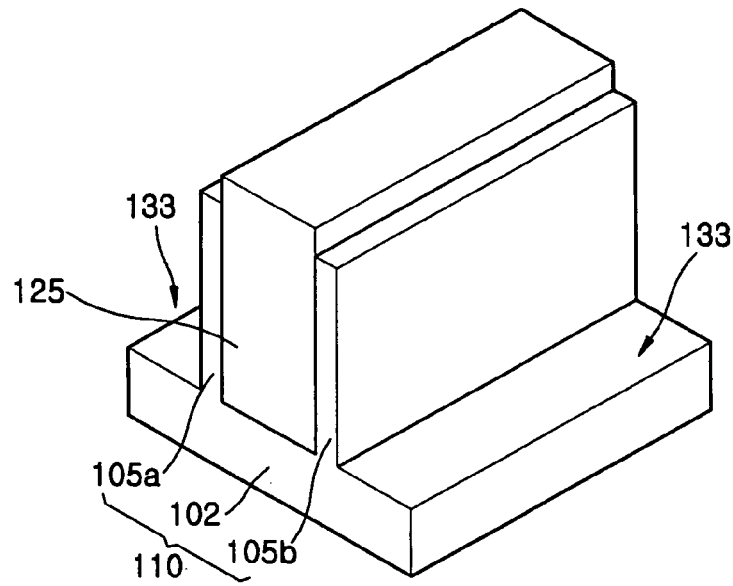

As illustrated in FIG. 5, the exposed portion of the semiconductor substrate 110 is etched using the second insulation layer spacers 130 as an etch protection film to form second trenches 133 and a pair of fins 105a and 105b protruding from the remaining body 102 of the semiconductor substrate 110. That is, the semiconductor substrate 110 includes the remaining body 102 and the pair of fins 105a and 105b adjacent the first insulation film 125.

A first side of each of the fins 105a and 105b contacts and is supported by the first insulation film 125. The support provided by the first insulation film improves the resistance of the fins to mechanical damage and allows the height of the fins to be increased and/or the width of the fins reduced, i.e., thereby increasing the aspect ratio (h/w) of the fins, relative to unsupported fins. Therefore, damage to and collapse of the fins 105a and 105b can be reduced.

Although a pair of fins 105a and 105b are illustrated in the drawings, as will be appreciated by those skilled in the art, a plurality of first insulation films 125 may be arranged in arrays with a corresponding pair of fins 105a and 105b formed on the sidewalls of each of the first insulation films 125.

Figure 6:
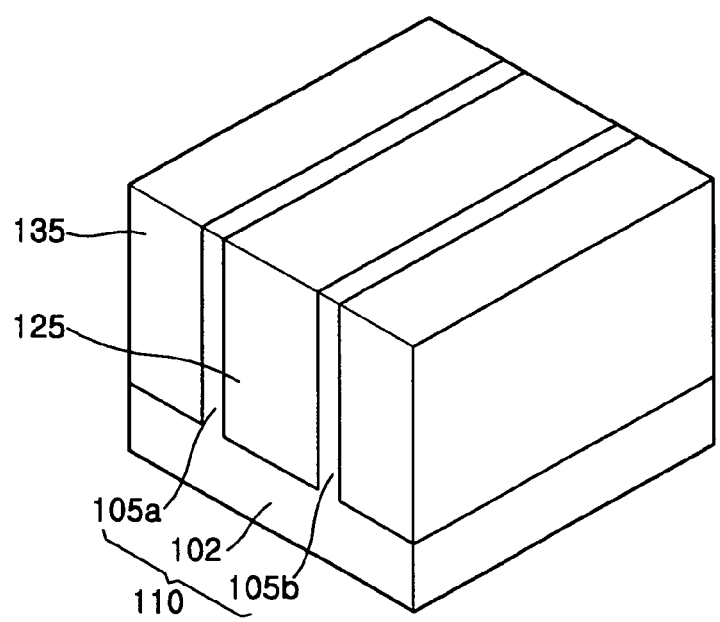

As illustrated in FIG. 6, a burying insulation film 135 is then formed to a thickness sufficient to fill the second trenches 133. Specifically, a third insulation layer (not shown), for example, a silicon oxide, is formed on the entire top surface of the structure illustrated in FIG. 5 to a thickness sufficient to fill at least the second trenches 133. An upper portion of this third insulation layer is then removed to expose top surfaces of the fins 105a and 105b, thereby forming the burying insulation film 135 and providing a planarized surface for subsequent processing. As will be appreciated by those skilled in the art, the burying insulation film 135 will tend to separate the pair of fins 105a and 105b from pairs of fins formed on adjacent first insulating films 125 (not shown).

Figure 7:
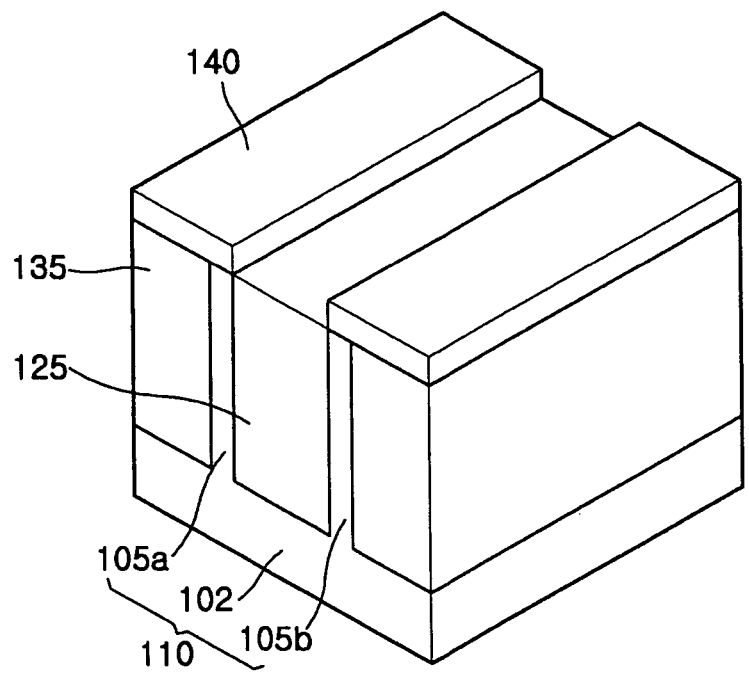

As illustrated in FIG. 7, an etch mask 140 is then formed to expose the first insulation film 125 while protecting the burying insulation film 135 is formed. For example, an etch mask layer (not shown) is formed on the entire top surface of the structure illustrated in FIG. 6 and is patterned using conventional means to form the etch mask 140.

The etch mask layer will typically be formed from a material having an etch selectivity to the first insulation film 125. For example, the etch mask layer may be a photoresist layer used in combination with a wet etch process can be performed. In the wet etching process, an etchant, for example, diluted HF or buffered oxide etchant (BOE), may be used to remove the first insulation film 125 without removing the etch mask 140.

Figure 8:
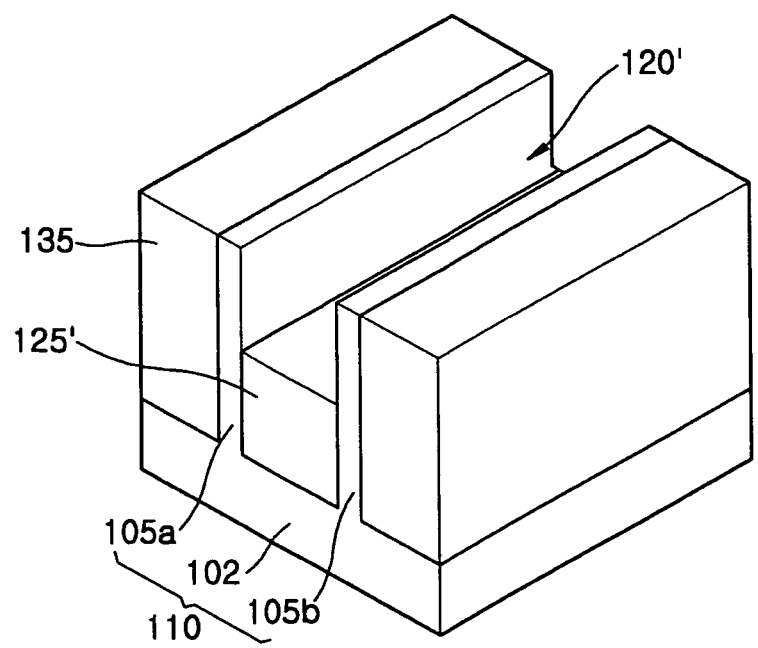

As illustrated in FIG. 8, a first thickness of the exposed portion of the first insulation film 125 is then removed using the etch mask 140 as an etch protection film to expose an upper portion 120' of the first trench and a device insulation film 125' comprising the residual portion of the first insulation film 125. The upper portion 120' of the first trench 120 is bounded by the device insulation film 125' and the upper portions of the fins 105a and 105b. As illustrated in FIG. 8, the fins 105a and 105b are supported by the both device insulation film 125' and the burying insulation film 135.

Figure 9:
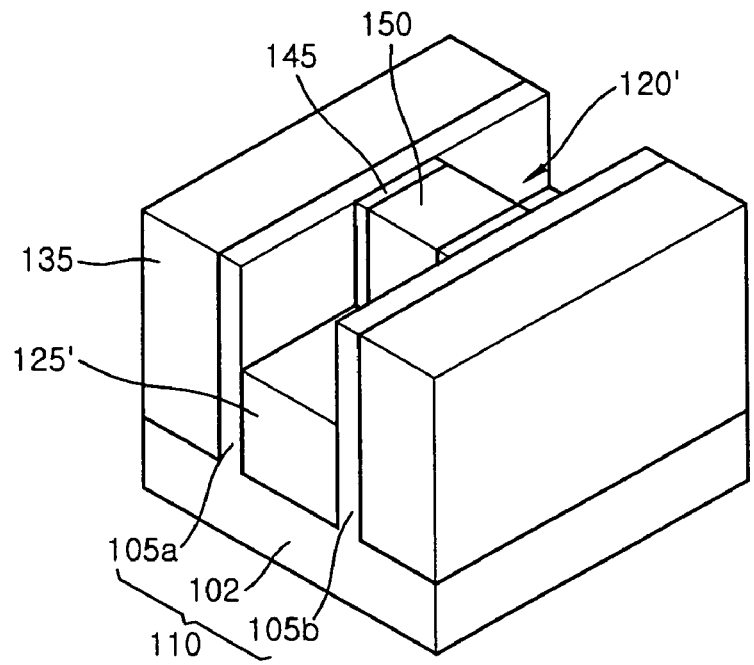

As illustrated in FIG. 9, a gate electrode 150 and gate insulation films 145 can then be formed on the device insulation film 125' between the fins 105a and 105b. The gate electrode 150 is disposed between the gate insulation films 145 and is thereby electrically insulated from the fins 105a and 105b. The gate electrode 150 is also electrically insulated from the body 102 by the device insulation film 125'. Portions of the fins 105a and 105b facing the sidewalls of the gate electrode 150 can be used as channel regions (not shown).

For example, a gate insulation layer (not shown) is formed on the upper portions of the fins 105a and 105b exposed in the upper portion 120' of the first trench 120. For example, the gate insulation layer may be formed by thermal oxidization of the exposed surfaces of fins 105a and 105b. A gate electrode layer (not shown) is formed on the gate insulation layer to a thickness at least sufficient to fill the upper portion 120' of the first trench 120. The gate electrode layer may be, for example, a polysilicon layer. An upper portion of the gate electrode layer is then removed to expose an upper surface of the burying insulation film 135 and provide a planarized surface for subsequent processing. The remaining portion of the gate electrode layer and the gate insulation layer are then patterned and etched to form the gate insulation films 145 and the gate electrode 150.

Figure 10:
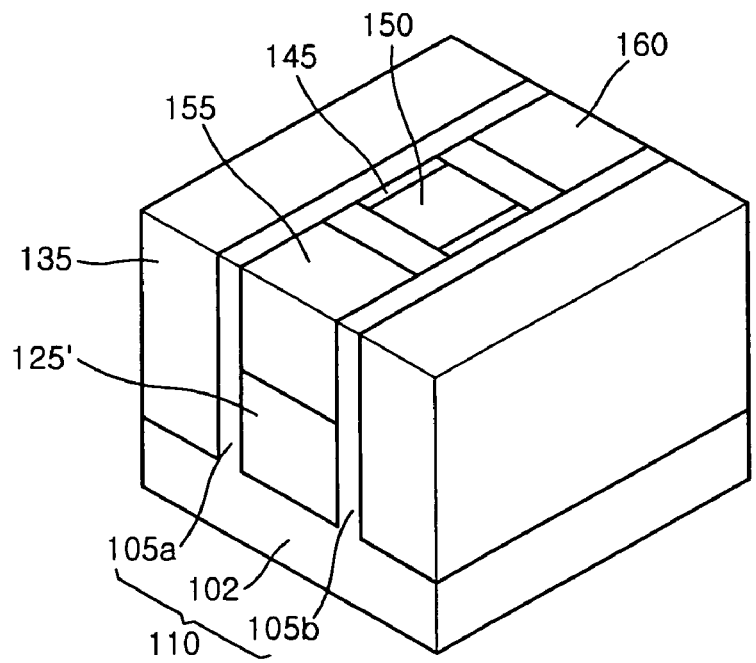

As illustrated in FIG. 10, a source contact plug 155 and a drain contact plug 160 can then be formed in the upper portion 120' of the first trench 120 on opposite sides of the gate electrode 150. The source contact plug 155 is electrically connected to both of the fins 105a and 105b with the contact regions serving as source regions (not shown). Similarly, the drain contact plug 160 is electrically connected to both of the fins 105a and 105b with the contact regions becoming drain regions (not shown).

For example, the source and drain regions may be portions of the fins 105a and 105b doped with impurities. The source and drain regions may be doped with the same conductive impurity or impurities, for example, one or more n-type impurities or p-type impurities.

Contact resistances between the source contact plug 155 and the source region and between the drain contact plug 160 and the drain region will be reduced relative to conventional fin-FET contacts because the source contact plug 155 and the drain contact plug 160 are simultaneously connected to both inner sides of the fins 105a and 105b. The impact of parasitic resistances, for example, contact resistance, tends to increase with increasing degrees of integration in semiconductor devices and will tend to limit the operating speed of the resulting device. Accordingly, the reduced contact resistance provided by source contact plug 155 and drain contact plug 160 will tend to decrease the parasitic resistance factor in highly integrated semiconductor devices, thereby increasing its operation speed.

Specifically, an interlayer insulation layer (not shown) covering the upper portion of the first trench 120' is formed at either side of the gate electrode 150. Next, a source contact hole (not shown) and a drain contact hole (not shown) may be formed through the interlayer insulation layer. A conductive plug layer (not shown) having a thickness sufficient to fill at least a source contact hole and a drain contact hole is then formed on the patterned interlayer insulation layer. The upper portion of the conductive plug layer is then removed to expose upper surfaces of fins 105a and 105b, thereby forming the source contact plug 155 and the drain contact plug 160 and providing a planarized surface for subsequent processing.

The conductive plug layer may include one or more materials selected from a group including, but not limited to, polysilicon doped with impurities, metals, metal nitrides and metal silicides and may have a multilayer structure including a combination of adhesion layers, barrier layers and/or primary conductive layers. In this case, an interlayer insulation layer may be formed between the source contact plug 155 and the gate electrode 150, and between the drain contact plug 160 and the gate electrode 150.

The semiconductor device can be completed using methods well known to those skilled in the art for fabricating the structures necessary to produce a functional semiconductor device. For example, if the semiconductor device is a logic device including a fin-FET, a conventional multi-layered metal wiring structure connecting to the source contact plug 155, the drain contact plug 160, and the gate electrode 150 may be formed to provide the desired functionality.

Alternatively, if the semiconductor device is a memory device including a fin-FET, for example, a dynamic random access memory (DRAM), a resistance random access memory (RRAM), a ferroelectric random access memory (FeRAM), or a phase change random access memory (PRAM), a storage node (not shown) may subsequently be formed on the source contact plug 155, or the drain contact plug 160. In addition, if the semiconductor device is a flash memory or a silicon oxide nitride oxide semiconductor (SONOS) memory device, a storage node (not shown) for storing or trapping electric charges may subsequently be formed between the gate electrode 150 and the gate insulation film 145. As will be appreciated by those skilled in the art, such a storage node would be insulated from the gate electrode 150 and would, therefore, be formed before forming the gate electrode 150.

Hereinafter, the structure and operation of the semiconductor device according to the example embodiment of the invention will be described with reference to FIG. 10. As illustrated in FIG. 10, the resulting fin-FET structure includes fins 105a and 105b, the burying insulation film 135 and the gate electrode 150 which are sequentially formed. It should be noted that the fins 105a and 105b are electrically connected to the lower portion of the body 102, and it is this structural difference from conventional SOI structures (in which the fins 105a and 105b would be insulated from the main semiconductor body) that provides some of the advantages of devices fabricated according to the invention. However, because the cross-sectional area of the portion of the fins 105a and 105b connected to the body 102 is very small compared to the entire surface area of the fins 105a and 105b, the semiconductor device according to the example embodiment of the invention can exhibit SOI-like behavior.

Specifically, the depletion region of the channel region and the source and drain regions in fins 105a and 105b may be limited during semiconductor device operation. In particular, as the widths of the fins 105a and 105b are reduced, the effects of the corresponding depletion regions in the body portion of the device will also be reduced. For example, the extent of the depletion regions produced during device operation are limited in the width direction of the fins 105a and 105b, but can be formed along the height direction of the fins 105a and 105b. Moreover, as the widths of the fins 105a and 105b are decreased, the influence of the depletion regions formed along the width direction is will be further reduced.

Accordingly, although the fins 105a and 105b are electrically connected to the body 102, the semiconductor substrate 110 can exhibit more SOI-like performance in which the off-current, contact leakage current and/or contact capacitance associated with an expanded the depletion region may be decreased. The decrease of the junction leakage current can enhance a sensing margin of a semiconductor device, for example, a memory device, and decrease the power consumption of the device. In addition, short channel effects associated with higher degrees of integration in semiconductor devices can be reduced.

Nevertheless, a body-bias can be applied to the fins 105a and 105b by applying a voltage to the body 102. Accordingly, the control over the threshold voltage of a semiconductor device utilizing this structure, for example, a CMOS fin-FET, can be improved relative to SOI configurations. For example, the body-bias between a NMOS fin-FET and a PMOS fin-FET may be controlled in such a manner that their respective threshold voltages are similar.

Second Example Embodiment

Figure 11:
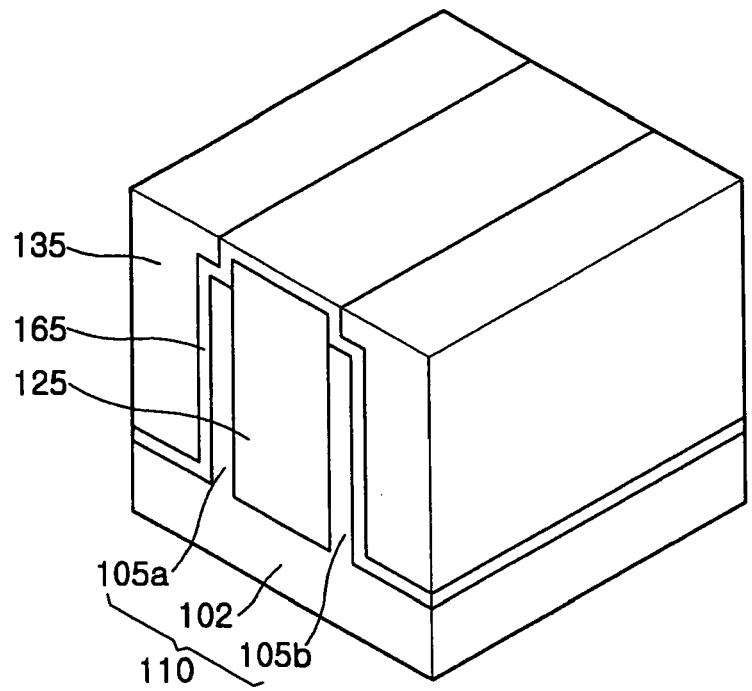
FIGS. 11 through 13 are perspective views illustrating a method of fabricating a semiconductor device according to another example embodiment of the invention.
Figure 12:
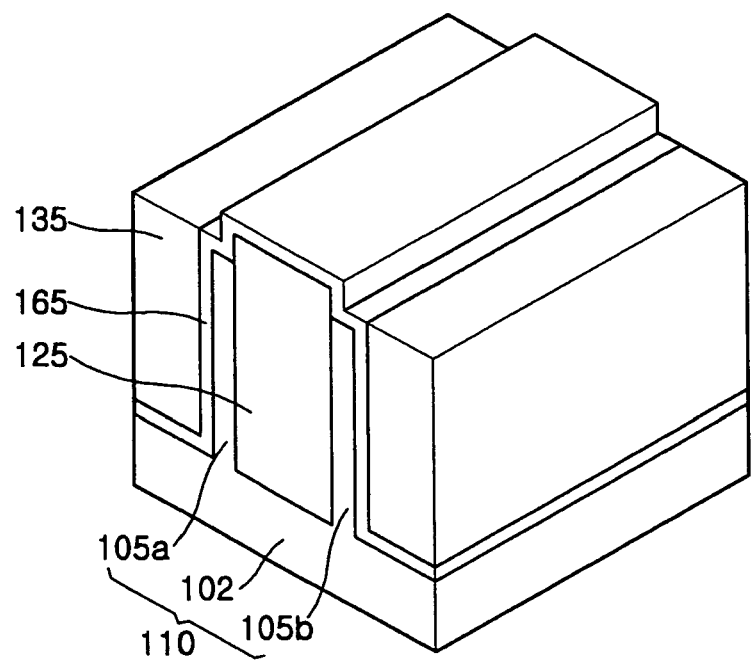
Figure 13:
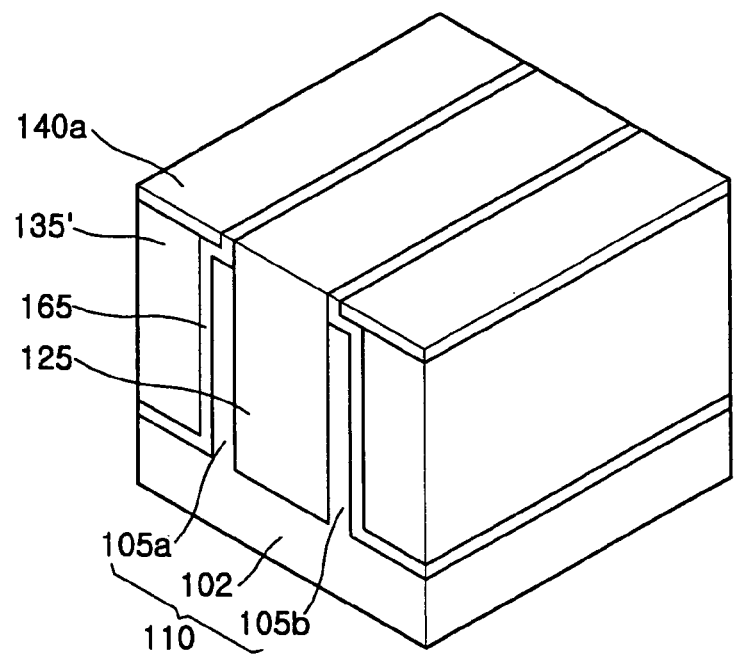

FIGS. 11-13 are perspective views illustrating a method of fabricating a semiconductor device according to another example embodiment of the invention. Because the second example embodiment is a modification of the first example embodiment, the structure and operation of the semiconductor device according to the second example embodiment of the invention can be described with reference to the structure and operation of the semiconductor device as detailed with respect to the first example embodiment in which corresponding reference numerals denote corresponding elements.

As illustrated in FIGS. 1-5, as the second trenches 133 are etched the pair of fins 105a and 105b contacting the sidewalls of the first insulation film 125 and protruding from the body 102 are formed from the residual portion of the semiconductor substrate. As illustrated in FIG. 11, in a departure from the first example embodiment, a pad insulation layer 165, for example, a nitride layer or an oxynitride layer, is formed over the structure of FIG. 5. A third insulation layer (not shown) is then formed on the pad insulation layer 165 to a thickness sufficient to fill at least remaining portion of the second trenches 133. An upper portion of the third insulation layer is then removed to expose an upper surface of the pad insulation layer 165, thereby forming a burying insulation film 135 and providing a planarized surface for subsequent processing. As illustrated in FIG. 12, an upper portion of the burying insulation film 135 formed on the fins 105a and 105b may then be removed using the pad insulation layer 165 as an etch protection film.

As illustrated in FIG. 13, an etch mask layer (not shown) is formed over the structure illustrated in FIG. 12. The etch mask layer may be formed of a material having an etch selectivity to the first insulation film 125. The etch mask layer may be, for example, a nitride layer or an oxynitride layer. An upper portion of the etch mask layer is then removed to expose the first insulation film 125, thereby forming an etch mask 140a and providing a planarized surface for subsequent processing.

Next, the semiconductor device will be completed according to example embodiment of the invention by performing the processes illustrated in FIGS. 8-10 of the first example embodiment. According to the second example embodiment of the invention, the etch mask 140a can be formed to cover the burying insulation film 135 and the fins 105a and 105b in a self-aligning manner. Accordingly, misalignment of the etch mask 140a can be prevented. As will be appreciated, if the etch mask inadvertently exposes a portion of the surface of the burying insulation film 135, a portion of the burying insulation film 135 may be removed along with the upper portion of the first insulation film 125 during the subsequent etch. Similarly, if the etch mask inadvertently covers a portion of the first insulation film 125, the covered portion of the first insulation film 125 may not be removed when the upper portion of the first insulation film 125 is removed to expose an upper portion 120' of the first trench 120. However, the problems associated with such misalignment of the etch pattern to the underlying structures can be reduced or avoided with the self-aligned etch mask 140a thereby improving the process margin, process yield and the reliability of the resulting semiconductor devices.

Third Example Embodiment

Figure 14:
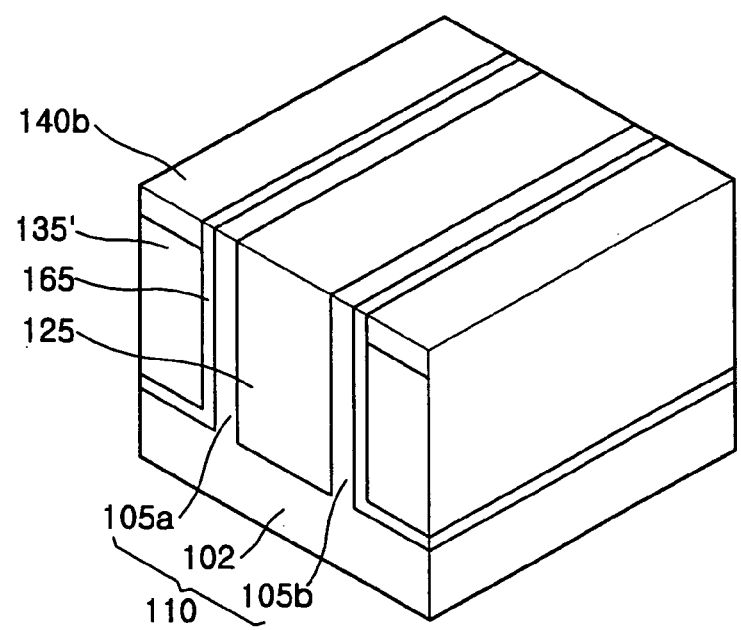
FIG. 14 is a perspective view for illustrating a method of fabricating a semiconductor device according to another example embodiment of the invention.

FIG. 14 is a perspective view for illustrating a method of fabricating a semiconductor device according to another example embodiment of the invention. Because the third example embodiment of the invention is a modification of the first and second example embodiments, the structure and operation of the semiconductor device according to the third example embodiment of the invention will be described with reference to the structure and operation of the semiconductor device detailed above in connection with the first and second example embodiment with corresponding reference numerals denoting corresponding elements.

As illustrated in FIGS. 1-5, etching the second trenches 133 forms the pair of fins 105a and 105b adjacent the sidewalls of the first insulation film 125 and protruding from the residual body 102 portion of the substrate 110. As illustrated in FIG. 12, an upper portion of the burying insulation film 135 is then removed. However, in accord with the third example embodiment of a method corresponding to the invention, more of the burying insulation film 135 will be removed relative to the etch process utilized in the second example embodiment. Accordingly, in the third example embodiment a portion of the pad insulation layers 165 formed on the upper portion of the sidewalls of the fins 105a and 105b will be exposed.

As illustrated in FIG. 14, an etch mask layer (not shown) is then formed over the structure of FIG. 12 where the pad insulation layers 165 formed on the sidewalls of the fins 105a and 105b are exposed. The etch mask layer may be, for example, a nitride layer or an oxynitride layer. Upper portions of the etch mask layer and the first insulation film 125 are then removed to expose upper surfaces of the fins 105a and 105b, thereby forming an etch mask 140b and providing a planarized surface for subsequent processing. The etch mask 140b and the pad insulation layer 165 may be formed from the same material layer, for example, a nitride. In this case, the nitride layers may be formed to contact the sidewalls of the fins 105a and 105b.

According to the third example embodiment, the etch mask 140b can be formed in a self-aligning manner, similar to the second example embodiment. Accordingly, the third example embodiment will exhibit the advantages noted with respect to the second example embodiment in reducing defects associated with misalignment of an etch mask. However, in the third example embodiment, the upper portions of the fins 105a and 105b are be exposed, thereby allowing the exposed upper portions of the fins 105a and 105b to be configured as additional channel regions.

Fourth Example Embodiment

Figure 15:
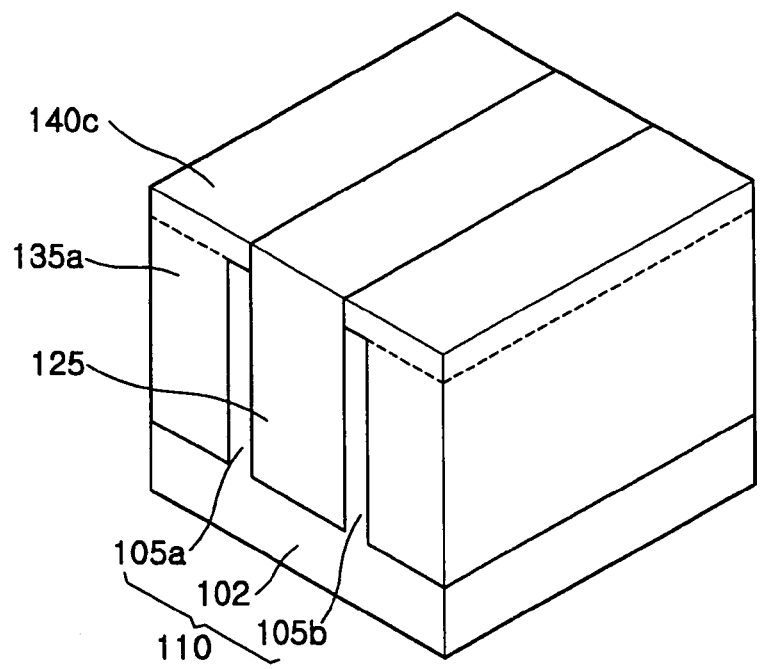
FIG. 15 is a perspective view for illustrating a method of fabricating a semiconductor device according to another example embodiment of the invention.

FIG. 15 is a perspective view for illustrating a method of fabricating a semiconductor device according to another example embodiment of the invention. Because the fourth example embodiment is a modification of the first example embodiment, the structure and operation of the semiconductor device according to the fourth example embodiment of the invention will be described with reference to the structure and operation of the semiconductor device as detailed above in connection with the first example embodiment in which corresponding reference numerals denote corresponding elements.

As illustrated in FIGS. 1-5, as the second trenches 133 are etched the pair of fins 105a and 105b are formed adjacent the sidewalls of the first insulation film 125 and protruding from the residual body 102 portion of the semiconductor substrate 110. As illustrated in FIG. 15, a third insulation layer (not shown) is then formed over the structure of FIG. 5 to a thickness sufficient to fill at least the second trenches 133. The third insulation layer may be formed of a material, for example, a nitride layer or an oxynitride layer having an etch selectivity to the first insulation film 125, for example, an oxide layer.

An upper portion of the third insulation layer is then removed to expose an upper surface of the first insulation film 125, thereby simultaneously forming burying insulation films 135a contacting both sidewalls of the fins 105a and 105b and an etch mask 140c disposed on the burying insulation films 135a and the upper surfaces of fins 105a and 105b. Although the burying insulation films 135a and the etch mask 140c are formed from the same layer, the different functional portions are indicated by dotted lines to simplify the subsequent discussion.

The fabrication of the semiconductor device can then be completed in accord with the processes detailed in connection with the first example embodiment of the invention by performing the processes illustrated in FIGS. 8-10 or equivalents thereof. For devices fabricated in accord with the fourth example embodiment, the self-aligned etch mask 140c can be formed on the burying insulation films 135a and the upper surfaces of fins 105a. Accordingly, the fourth example embodiment will tend to exhibit the advantages detailed above with respect to the second and third example embodiments in reducing defects associated with misalignment of an etch mask.

Fifth Example Embodiment

Figure 16:
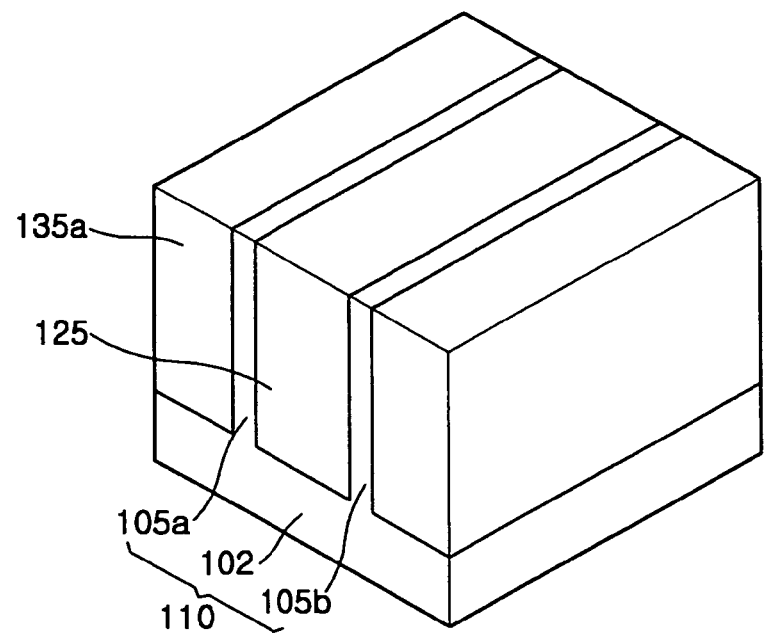
FIG. 16 is a perspective view for illustrating a method of fabricating a semiconductor device according to another example embodiment of the invention.

FIG. 16 is a perspective view for illustrating a method of fabricating a semiconductor device according to another example embodiment of the invention. Because the fifth example embodiment is a modifications of the first example embodiment, the structure and operation of the semiconductor device according to the fifth example embodiment of the invention will be described with reference to the structure and operation of the semiconductor device detailed above in connection with the first example embodiment with corresponding reference numerals denoting corresponding elements.

As illustrated in FIG. 15, the process of planarizing the third insulation layer may be extended to remove an upper portion of the first insulation film 125 and to expose upper surfaces of the fins 105a and 105b. As illustrated in FIG. 16, the burying insulation films 135a are formed on sidewalls of the fins 105a and 105b but no etch mask is provided on the upper surfaces of the fins 105a and 105b. However, by selecting the material used to form the burying insulation film 135 to provide an etch selectivity with respect to the material used to form the first insulation film 125, the burying insulation films 135a can substantially act as an etch mask.

According to the fifth example embodiment, the burying insulation film 135a can be formed in a self-aligning manner and can function to some extent as an etch mask whereby the upper portions of the fins 105a and 105b opposite the burying insulation film 135a may be exposed. Accordingly, the fifth example embodiment can provide some of the have the same advantages as those of provided by the third and fourth example embodiments in reducing defects associated with misalignment of an etch mask but with less complex processing.

According to the example embodiments of the invention, a variety of semiconductor devices incorporating a fin-FET structure, for example, memory devices and/or logic devices, may be manufactured. In addition, a random access memory according to the invention may have a NOR-type array structure in which unit cells are arranged in a matrix manner.

While the invention has been particularly shown and described with reference to certain example embodiments thereof, it will be understood by those of ordinary skill in the art that various changes in form and details may be made therein without departing from the spirit and scope of the invention as defined by the following claims.

What is claimed is:

1. A method of manufacturing a semiconductor device comprising:
    forming a first trench having a first depth in a semiconductor substrate;
    forming a first insulation film in the a first trench whereby an upper portion of the first insulation film extends above a plane defined by an upper surface of the semiconductor substrate;
    forming insulating spacers adjacent sidewalls on the upper portion of the first insulation film whereby the spacers extend across a first portion of the upper surface of the semiconductor substrate and exposing a second portion of the upper surface of the semiconductor substrate; and
    removing a first thickness of the semiconductor substrate underlying the second portion of the upper surface of the semiconductor substrate to form second trench structures and thereby form a pair of fins adjacent opposite sidewalls of the first insulation film.

2. The method of manufacturing a semiconductor device according to claim 1, further comprising:
    filling the second trench structures with a third insulation film; and
    removing an upper portion of the first insulation film while substantially maintaining the thickness of the third insulation film to form a residual first insulation film and to expose upper surface portions of the fins above the residual first insulation film.

3. The method of manufacturing a semiconductor device according to claim 1, wherein forming the first insulation film further comprises:
    forming a hard mask pattern on the semiconductor substrate;
    etching the semiconductor substrate using the hard mask pattern as an etch protection film to form the first trench;
    filling the first trench with a first insulation layer;
    removing an upper portion of the first insulation layer to expose an upper surface of the hard mask pattern and form the first insulation film; and
    removing the hard mask pattern.

4. The method of manufacturing a semiconductor device according to claim 1, wherein forming the insulating spacers further comprises:
    forming a second insulation layer over the first insulation film and the upper surface of the semiconductor substrate; and
    removing a portion of the second insulation layer using an anisotropic etch to expose the second portion of the upper surface of the semiconductor substrate.

5. The method of manufacturing a semiconductor device according to claim 1, wherein:
    removing the upper portion of the first insulation film utilizes a wet etch process.

6. The method of manufacturing a semiconductor device according to claim 2, further comprising:
    forming a storage node on the upper surface portions of the fins, wherein the storage node is electrically insulated from the upper surface portions of the fins.

7. A method of manufacturing a semiconductor device comprising:
    forming a first trench in a semiconductor substrate;
    forming a first insulation film in the first trench with an upper portion protruding from the semiconductor substrate;
    forming insulating spacers adjacent sidewalls on the upper portion of the first insulation film;
    forming second trenches by removing portions of the semiconductor substrate not protected by the insulating spacers, thereby forming a pair of fins adjacent the first insulation film and extending from a residual body of the semiconductor substrate;
    filling the second trenches with a third insulation film;
    forming an etch mask that exposes an upper surface of the first insulation film and protects an upper surface of the third insulation film; and
    removing an upper portion of the first insulation film to form a residual first insulation film and open a space between exposed upper inner sidewall portions of the fins.

8. The method of manufacturing a semiconductor device according to claim 7, further comprising:

forming a source contact plug on the residual first insulation film; and forming a drain contact plug on the residual first insulation film to be spaced apart from the source contact plug, wherein both the source contact plug and the drain contact plug are in electrical contact with the exposed upper sidewall portions of both fins.

9. The method of manufacturing a semiconductor device according to claim 7, wherein:

the etch mask exposes upper surfaces of the fins.

10. The method of manufacturing semiconductor device according to claim 9, wherein:

the etch mask extends along outer sidewalls of the pair of fins.

11. The method of manufacturing a semiconductor device according to claim 7, wherein:

the etch mask protects upper surfaces of the pair of fins.

12. The method of manufacturing a semiconductor device according to claim 7, wherein forming the third insulation film further comprises, in order:

forming an intermediate insulation layer over the first insulating film, the pair of fins and an exposed surface of the residual body of the semiconductor substrate;

forming a third insulation layer over the intermediate insulation layer to fill the second trenches;

removing an upper portion of the third insulation layer to expose a surface portion of the intermediate insulation layer above the first insulation film, to form the third insulation film and to form a planarized surface;

removing an upper portion of the third insulation film;

forming an etch protection layer; and removing an upper portion of the etch mask layer to form an etch mask that exposes an upper surface of the first insulation film.

13. The method of manufacturing a semiconductor device according to claim 12, wherein removing an upper portion of the third insulation layer further comprises:

establishing an upper surface of the third insulation film that lies below a plane defined by upper surfaces of the pair of fins before forming the etch protection layer.

14. The method of manufacturing a semiconductor device according to claim 12, wherein:

removing an upper portion of the etch mask layer to form an etch mask also exposes an upper surface of the intermediate insulation layer.

15. The method of manufacturing a semiconductor device according to claim 12, wherein forming the etch mask and the third insulation film comprises:

filling the second trenches with the third insulation layer; and removing an upper portion of the third insulation layer to form a planarized surface exposing the etch mask and an upper surface of the first insulation film.

* * * * *